(12) United States Patent
Sakare et al.

(10) Patent No.: US 11,774,496 B2
(45) Date of Patent: Oct. 3, 2023

(54) PSEUDO-RANDOM BINARY SEQUENCES (PRBS) GENERATOR FOR PERFORMING ON-CHIP TESTING AND A METHOD THEREOF

(71) Applicant: INDIAN INSTITUTE OF TECHNOLOGY, Punjab (IN)

(72) Inventors: Mahendra Sakare, Punjab (IN); Puneet Singh, Punjab (IN); Mayank Kumar Singh, Punjab (IN); Devarshi Mrinal Das, Punjab (IN); Vinayak Gopal Hande, Punjab (IN)

(73) Assignee: INDIAN INSTITUTE OF TECHNOLOGY, Punjab (IN)

( * ) Notice: Subject to any disclaimer, the term of this patent is extended or adjusted under 35 U.S.C. 154(b) by 0 days.

(21) Appl. No.: 17/578,526

(22) Filed: Jan. 19, 2022

(65) Prior Publication Data
US 2022/0317181 A1    Oct. 6, 2022

(30) Foreign Application Priority Data
Mar. 23, 2021   (IN) .............................. 202111012409

(51) Int. Cl.
*G01R 31/3183*    (2006.01)
*G01R 31/3177*    (2006.01)
*G01R 31/3185*    (2006.01)

(52) U.S. Cl.
CPC .  *G01R 31/318385* (2013.01); *G01R 31/3177* (2013.01); *G01R 31/3185* (2013.01);
(Continued)

(58) Field of Classification Search
CPC ........ G01R 31/318385; G01R 31/3177; G01R 31/3185; G01R 31/318502;
(Continued)

(56) References Cited

U.S. PATENT DOCUMENTS

| | | | |
|---|---|---|---|
| 5,446,683 A * | 8/1995 | Mullen .................... | G06F 11/27 714/E11.169 |
| 7,493,530 B2 * | 2/2009 | Tan ........................ | H04L 1/0045 714/704 |

(Continued)

OTHER PUBLICATIONS

Sakare, A Power and Area Efficient Architecture of a PRBS Generator With Multiple Outputs, Aug. 2017, IEEE, vol. 64, No. 8 , pp. 927-931. (Year: 2017).*

(Continued)

*Primary Examiner* — John J Tabone, Jr.
(74) *Attorney, Agent, or Firm* — SZDC LAW P.C.

(57) ABSTRACT

Disclosed herein is a pseudo-random binary sequence (PRBS) generator (200) for performing on-chip testing. It comprises of a plurality of lanes (L1-L4), wherein each lane comprises a latch group (Lg1-Lg4) capable of receiving clock signals, wherein a number of latches in each latch group is based on an output sequence to be generated for performing the on-chip testing. Each latch group is having at least one of a flip-flop and a latch is further connected with a plurality of logic gates in such a manner that an output, generated by the at least one of the flip-flop and the latch of each latch group, is provided as an input to the plurality of logic gates.

10 Claims, 18 Drawing Sheets

(52) U.S. Cl.
CPC ............... *G01R 31/318502* (2013.01); *G01R 31/318522* (2013.01); *G01R 31/318525* (2013.01); *G01R 31/318552* (2013.01); *G01R 31/318594* (2013.01)

(58) Field of Classification Search
CPC .... G01R 31/318522; G01R 31/318525; G01R 31/318552; G01R 31/318594
USPC ......................................... 714/731, 734, 704
See application file for complete search history.

(56) References Cited

U.S. PATENT DOCUMENTS

| | | | |
|---|---|---|---|
| 7,515,916 B1* | 4/2009 | Alexander | H04W 24/08 345/582 |
| 2008/0228951 A1* | 9/2008 | Chow | H03K 19/1733 710/10 |
| 2011/0299581 A1* | 12/2011 | Le-Gall | G01R 31/318385 375/224 |
| 2011/0302471 A1* | 12/2011 | Le-Gall | G01R 31/318385 714/E11.169 |
| 2013/0055039 A1* | 2/2013 | Dearth | G11C 29/028 708/251 |
| 2015/0194950 A1* | 7/2015 | Mahendra | H03K 3/356078 327/202 |
| 2016/0087681 A1* | 3/2016 | Dhayni | H04B 5/0068 455/41.1 |
| 2019/0349225 A1* | 11/2019 | Johnstone | H04L 25/03872 |
| 2022/0317181 A1* | 10/2022 | Sakare | G01R 31/3177 |

OTHER PUBLICATIONS

Bommalingaiahnapallya et al., High-Speed Circuits for a Multi-Lane 12 Gbps CMOS PRBS Generator, 2007, IEEE, pp. 3896-3899. (Year: 2007).*

* cited by examiner

300

Providing a plurality of lanes, wherein each lane comprises a latch group capable of receiving clock signals, wherein a number of latches in each latch group is based on the output sequence to be generated for performing the on-chip testing  ⟋ 301

Connecting each latch group having at least one of a flip flop and a latch with a plurality of logic gates in such a manner that an output, generated by the at least one of the flip-flop and the latch of each latch group, is provided as an input to the plurality of logic gates for generating the output sequence required for performing the on-chip testing  ⟋ 303

FIG. 23

PSEUDO-RANDOM BINARY SEQUENCES (PRBS) GENERATOR FOR PERFORMING ON-CHIP TESTING AND A METHOD THEREOF

CROSS-REFERENCE TO RELATED APPLICATIONS AND PRIORITY

The present application claims benefit from Indian Patent Application No. 202111012409 filed on 23 Mar. 2021 the entirety of which is hereby incorporated by reference.

TECHNICAL FIELD

The present disclosure relates to electronics and communication engineering. More specifically, this disclosure relates to a pseudo-random binary sequence (PRBS) generator and a method for generating a pseudo-random binary sequence using the pseudo-random binary sequence (PRBS) generator.

BACKGROUND

Usage of the internet leads to demand for a large amount of data. The improvement in integrated circuits high-speed to tackle such extensive data. These high-speed circuits are part of the chip-to-chip communication at interfaces. Testing of such high-speed integrated circuits is also challenging and an essential part of circuit design. Pseudo-random bit sequence (PRBS) generators are widely accepted for examining the correct operation of high-speed integrated circuits, such as re-timing circuits, serializers, deserializers, and transceivers.

PRBSs help in verifying dynamic performance exhaustively. The PRBS signals are also used for bit error rate (BER) testing. The equipment available in the market for generating random PRBS signals is costly. Apart from that, it is preferable to test chip-to-chip communication by an on-chip PRBS generator, which is in the same design environment. The on-chip PRBS generator also provides useful quality input to the device under test (DUT).

Additionally, the PRBS generator is also used in a digital-to-analog converter (DAC) for dynamic element matching. As demand for high-speed circuits is escalating for achieving high data-rates, the requirement for high-speed PRBS generators is enhanced. Implementation of full-rate PRBS generators at high speeds is difficult. Each building block (such as latches, D flip-flops (DFFs), XOR gates, multiplexer) of the PRBS generator draws many currents for achieving higher rates. Large size devices are required for carrying these currents, which results in an increased area. Multi-rate PRBS generators are designed as a solution to this problem. In the widely used parallel implementation, the PRBS generator core is designed in low frequency, and multiplexers (MUXs) are used to double the data rate.

However, extensive multiplexing results in considerably higher power consumption in MUX and retiming circuits than the PRBS generators core. Therefore, deep multiplexing is undesirable in PRBS generators with the existing techniques.

Accordingly, the present disclosure is directed towards solving the above-identified and other problems existing in the art.

Object of the Disclosure

An object of the present disclosure is to provide a pseudo-random binary sequence generator.

Another object of the present disclosure is to provide a method for generating a pseudo-random binary sequence using the pseudo-random binary sequence generator.

SUMMARY

The present disclosure overcomes one or more shortcomings of the prior art and provides additional advantages discussed throughout the present disclosure. Additional features and advantages are realized through the techniques of the present disclosure. Other embodiments and aspects of the disclosure are described in detail herein and are considered a part of the claimed disclosure.

In an embodiment of the present disclosure, a pseudo-random binary sequence (PRBS) generator for performing on-chip testing is disclosed. The pseudo-random binary sequences (PRBS) generator comprises of a plurality of lanes (L1-L4), wherein each lane comprises a latch group ($L_{g1}$-$L_{g4}$) capable of receiving clock signals, wherein a number of latches in each latch group are based on an output sequence to be generated for performing the on-chip testing. Each latch group is having at least one of a flip flop and a latch are further connected with a plurality of logic gates in such a manner that an output, generated by at least one of the flip-flop and the latch of each latch group, is provided as an input to the plurality of logic gates for generating the output sequence required for performing the on-chip testing.

In yet another embodiment of the present disclosure, at least one of the plurality of logic gates and at least one latch in each latch group operate at a half clock frequency.

In still another embodiment of the present disclosure, the latches in each latch group are connected in series.

In yet another embodiment of the present disclosure, the output sequence is generated at the double clock frequency.

In still another embodiment of the present disclosure, each logic gate is XOR logic gate.

In yet another embodiment of the present disclosure, the plurality of lanes composed of a combination of at least one of 6 flip flops, 2 latches, and 7 logic gates; 8 flip flops, 2 latches and 7 logic gates; or 14 flip flops, 2 latches, and 7 logic gates.

In another embodiment of the present disclosure, a method for generating an output pseudo-random binary sequence (PRBS) for performing on-chip testing by using a pseudo-random binary sequence (PRBS) generator is disclosed. The method comprises providing a plurality of lanes, wherein each lane comprises a latch group capable of receiving clock signals, wherein a number of latches in each latch group are based on the output sequence to be generated for performing the on-chip testing. The method further comprises connecting each latch group having at least one of a flip flop and a latch with a plurality of logic gates in such a manner that an output, generated by the at least one of the flip-flop and the latch of each latch group, is provided as an input to the plurality of logic gates for generating the output sequence required for performing the on-chip testing.

In yet another embodiment of the present disclosure, the method further comprises operating at least one of the plurality of logic gates and at least one latch in each latch group at a half clock frequency.

In still another embodiment of the present disclosure, the method further comprises connecting the latches in each latch group in series.

In yet another embodiment of the present disclosure, the method further comprises generating the output sequence at double clock frequency.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The accompanying drawings, which are incorporated in and constitute a part of this disclosure, illustrate exemplary embodiments and, together with the description, serve to explain the disclosed embodiments. In the figures, the left-most digit(s) of a reference number identifies the figure in which the reference number first appears. The same numbers are used throughout the figures to reference features and components. Some embodiments of apparatus and/or methods in accordance with embodiments of the present subject matter are now described, by way of example only, and with reference to the accompanying figures, in which:

FIG. 23 shows a flow chart depicting a method for generating an output pseudo-random binary sequence (PRBS) for performing on-chip testing by using pseudo-random binary sequence (PRBS) generator, in accordance with an embodiment of the present disclosure.

The figures depict embodiments of the disclosure for purposes of illustration only. One skilled in the art will readily recognize from the following description that alternative embodiments of the structures and methods illustrated herein may be employed without departing from the principles of the disclosure described herein.

DETAILED DESCRIPTION

In the present document, the word "exemplary" is used herein to mean "serving as an example, instance, or illustration." Any embodiment or implementation of the present subject matter described herein as "exemplary" is not necessarily to be construed as preferred or advantageous over other embodiments.

In the following detailed description of the embodiments of the disclosure, reference is made to the accompanying drawings that form a part hereof, and in which are shown by way of illustration specific embodiments in which the disclosure may be practiced. These embodiments are described in sufficient detail to enable those skilled in the art to practice the disclosure, and it is to be understood that other embodiments may be utilized and that changes may be made without departing from the scope of the present disclosure. The following description is, therefore, not to be taken in a limiting sense.

Figure 1:
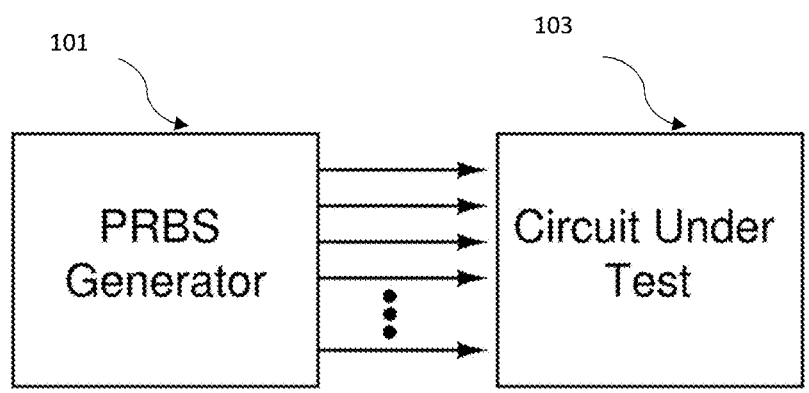
FIG. 1 shows a block diagram for testing a circuit.

Disclosed herein is a pseudo-random bit sequence (PRBS) generator and method for generating A pseudo-random bit sequence. The pseudo-random bit sequence (PRBS) architecture generates four uncorrelated maximum length sequences, which results in low power consumption and less area requirement. Due to the high cost of equipment for testing high-speed circuits and systems, it is better to use on-chip testing circuits in the same environment where the circuit under test is placed. In the present disclosure, a low power and area four doubled rate output PRBS generator is disclosed that ensures exhaustive testing of high-speed circuits and systems. In the disclosed architecture, four XOR gates connected with the output signals are operating at full speed data rate, and the rest of the building blocks, such as DFF, latches, and other XOR gates, are working at half of the output data rate. The details of the disclosed pseudo-random bit sequence (PRBS) generator are provided in below paragraphs:

FIG. 1 shows the basic block diagram (100) for testing a circuit (103) using a pseudo-random binary sequence (PRBS) generator (101), where multiple uncorrelated random signals are used. The circuit (103) under test is placed next to the PRBS generator (101). The pseudo-random sequence generated by the PRBS generator (101) is taken to the circuit under test. For example, the clock and data recovery (CDR) circuit can be a circuit under test and it needs the random sequence data to check the CDR functionality. PRBS generator (101) fulfills the requirement of the CDR circuit for random data testing.

Figure 2:
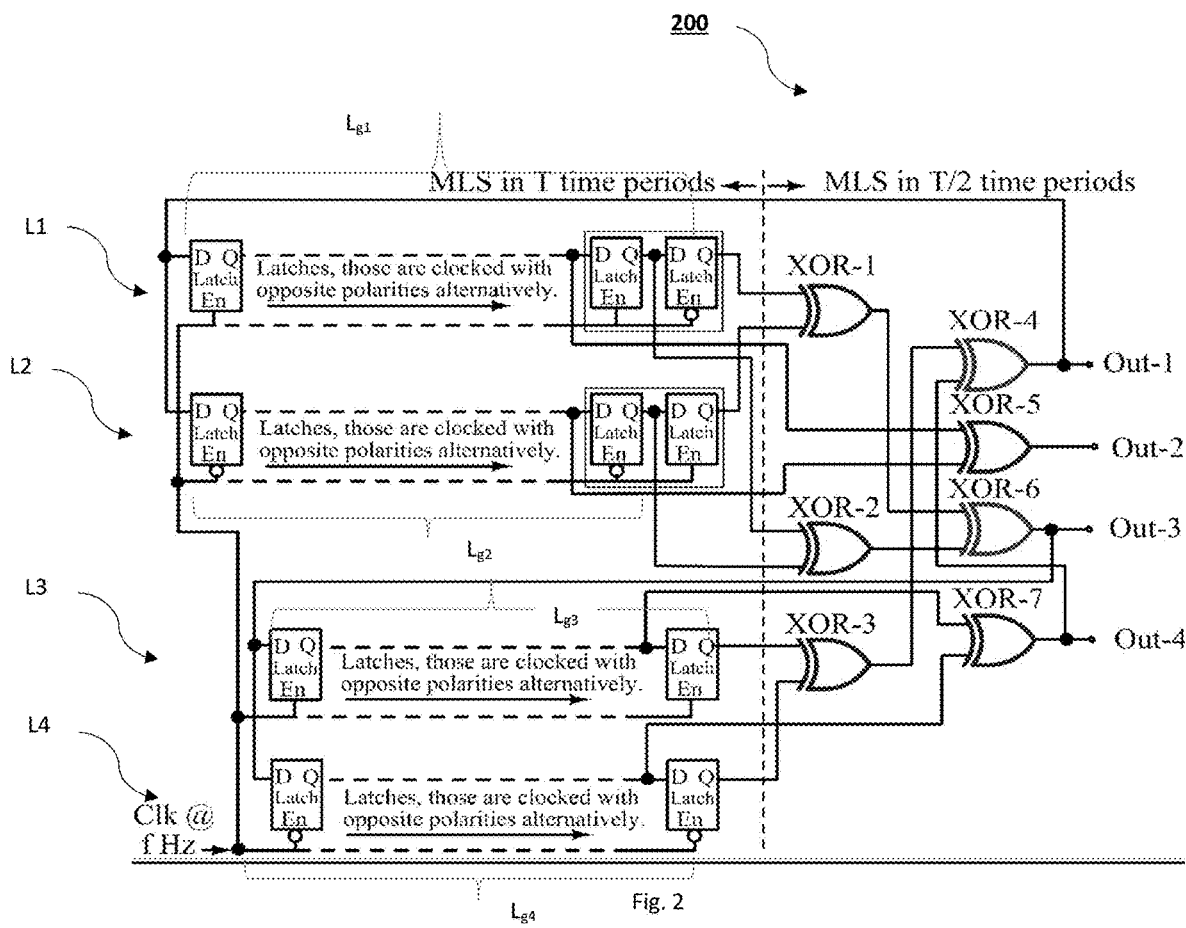
FIG. 2 shows a general circuit diagram of a pseudo-random binary sequence (PRBS) generator, in accordance with an embodiment of the present disclosure.

FIG. 2 shows a general circuit diagram of a pseudo-random binary sequence (PRBS) generator, in accordance with an embodiment of the present disclosure. As shown in FIG. 2, the pseudo-random binary sequence (PRBS) generator (200) may comprise a plurality of lanes (L1-L4). Each lane in the plurality of lanes may comprise a latch group ($L_{g1}$-$L_{g4}$). The latch group may comprise at least one latch and one flip-flop. In an embodiment, the latch is a D-latch and the flip flop is a D-flip flop. The latch and the flip flop in each latch group are capable of receiving clock signals as an input. As shown in FIG. 2, the pseudo-random binary sequence (PRBS) generator (200) may also comprise of a plurality of logic gates in such a manner that each logic gate is connected to at least one latch and at least one flip flop of the latch groups ($L_{g1}$-$L_{g4}$). It can be seen that an output, generated by at least one of the flip flop and the latch of each latch group is provided as an input to the plurality of logic gates for generating the output sequence required for performing the on-chip testing. As can be seen in FIG. 2, the latches in each latch group ($L_{g1}$-$L_{g4}$) are connected in series.

Figure 3:
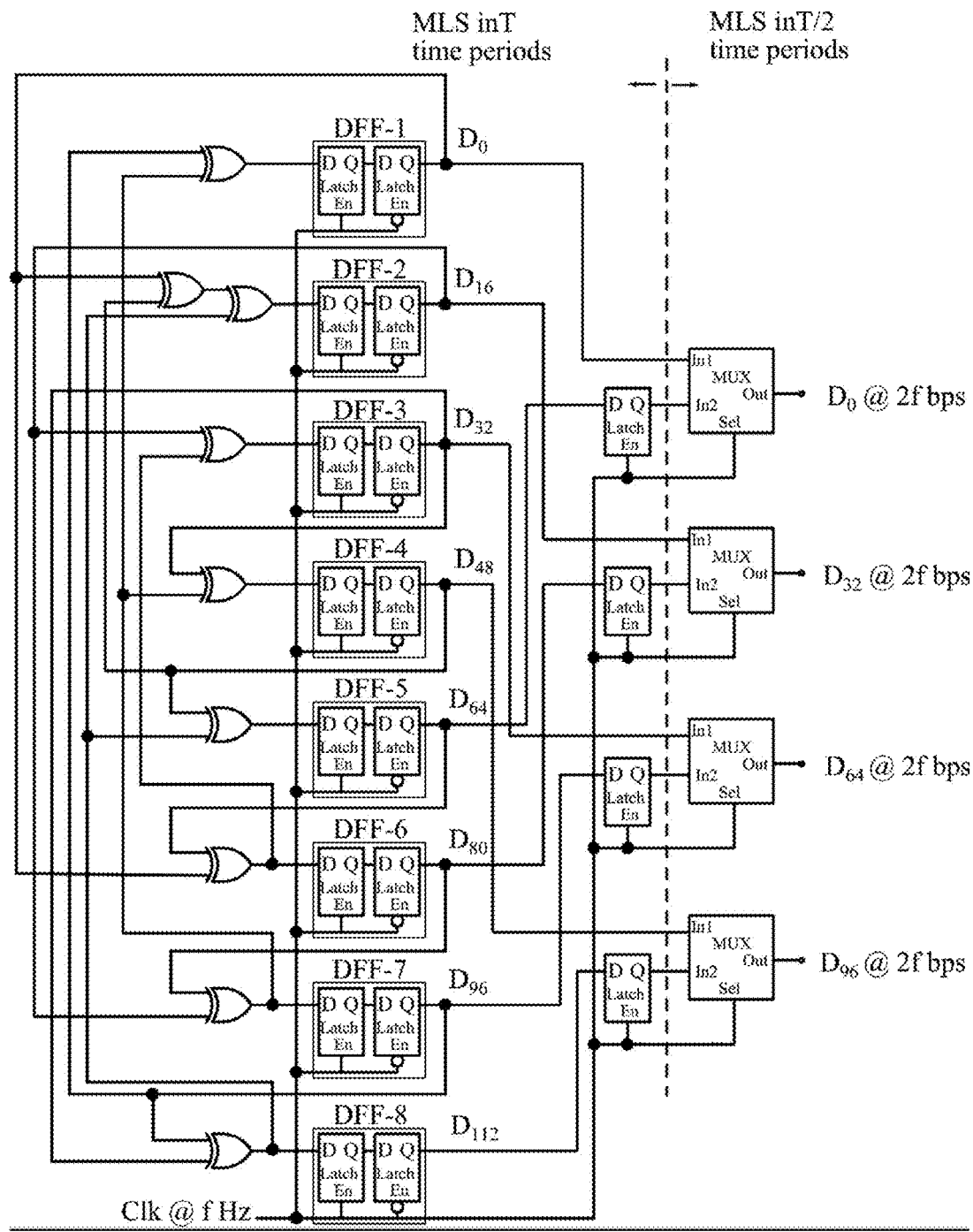
FIG. 3 shows a circuit diagram of a $2^7-1$ pseudo-random binary sequence (PRBS) generator, in accordance with prior art.

In an embodiment, the plurality of logic gates may be XOR gate and the pseudo-random binary sequence (PRBS) generator (200) may comprise of 7 logic gates. In an embodiment, a number of latches in each latch group may be based on an output sequence to be generated for performing the on-chip testing. For example, the number of latches may be different for a $2^7-1$ generator and may be different for a $2^9-1$ generator. The various embodiments of the disclosed pseudo-random binary sequence (PRBS) generator (200) with different number of sequences are defined in below paragraphs:

FIG. 3 shows a conventional pseudo-random binary sequence (PRBS) generator. Multiple output PRBSs are preferred for testing multiple input circuits under test for better extraction of dynamic response in high speed circuits. Multi-rate PRBS generators are popular to reduce the power dissipation in PRBS generators. In the multi-rate PRBS generator retiming circuits along with MUXs are used to double the data rate. The retiming circuits are necessary to maintain the maximum length sequence (MLS). However, multiple levels of multiplexing is not much effective because most of the power dissipated in retiming and MUXs. Thus, a half-rate PRBS generator is chosen over a full rate PRBS generator in the invented PRBS generators. There are two types of implementations in multi-rate PRBS generators: series implementation and parallel implementation. In a series implementation, phase rotation logic, which uses the subsequence property of PRBS, is needed to be designed before applying PRBS to retiming circuits followed by MUXs. According to the subsequence property of PRBS, if two PRBS are MLS apart and multiplexed then, it doubles the data rate.

In the parallel implementation, the PRBS generator core is modified to create equal MLS apart sequences, and then retiming circuits followed by MUXs are applied to enhance the data-rate. FIG. 3 shows commonly used parallel implementation of half-rate $2^7-1$ PRBS generator, which comprises 20 D-latches, 9 XOR gates, and 4 MUXs. It is known that the D-flip flops (DFF) are made from D-latches by connecting them in master-slave fashion. That is the reason why two latches involved in constituting DFF are oppositely clocked. As shown in FIG. 3, there is one latch connected at the one of the input of MUX to retime the data. The MUXs are working on the doubled frequency than the D-latches. The output data-rate of the PRBS generator is doubled compared to applied clock frequency in this case. However, this architecture results in high power consumption and occupies high areas.

Figure 4:
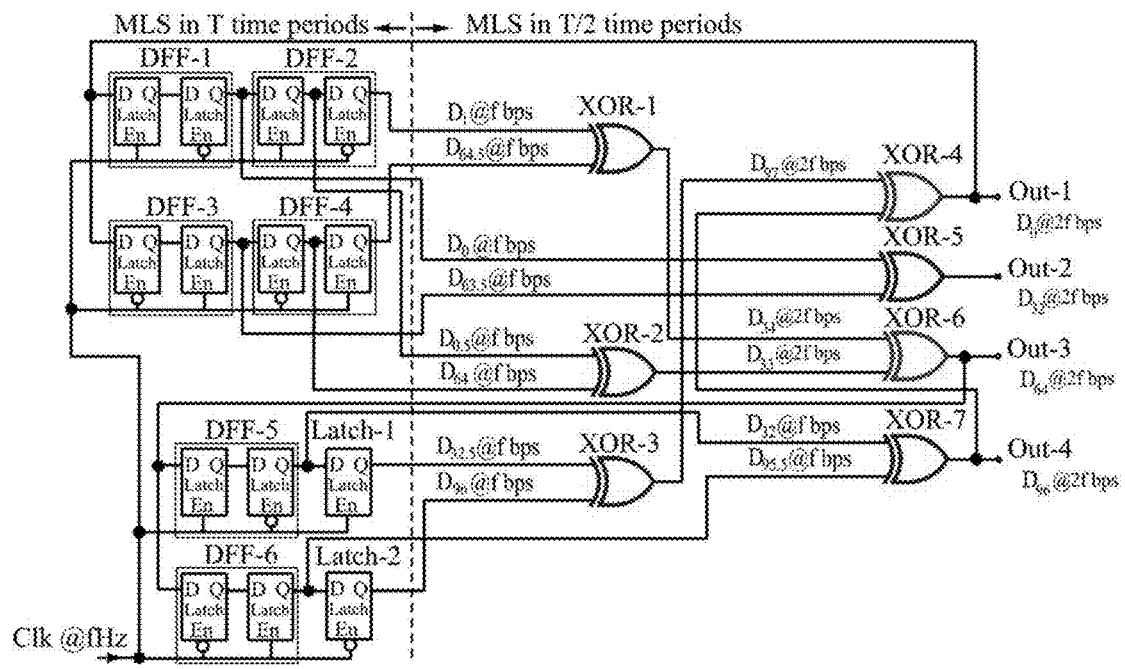
FIG. 4 shows a circuit diagram of the $2^7-1$ pseudo-random binary sequence (PRBS) generator, in accordance with an embodiment of the present disclosure.

FIG. 4 shows a circuit diagram of four uncorrelated output half-rate $2^7-1$ pseudo-random binary sequence (PRBS) generators, in accordance with the first embodiment of the present disclosure. As shown in FIG. 4, the disclosed PRBS generator may consists of 4 lanes, each having a latch group and a plurality of logic gates i.e. XOR gates. In this embodiment, a pseudo-random binary sequence (PRBS) generator may comprise of 6 D flip flop (DFF), 2 latches, and 7 XOR gates. In an embodiment, half of the circuit works at the clock frequency and the second half of the circuit is at doubled clock frequency.

The characteristics equation for the disclosed $2^7-1$ pseudo-random binary sequence (PRBS) generator architecture is:

$$D_7 \oplus D_3 \oplus D_0 = 0 \quad (1)$$

As can be seen in FIG. 4, the latches are connected in series in four different lanes. The latches are clocked with opposite polarity in each of the lanes and every next latch is also clocked with opposite polarity. XOR gates (XOR-4, XOR-5, XOR-6 and XOR-7) are used to double the data rate at the output. The difficulty of getting desired delays at the input XOR gates (XOR-4, XOR-5, XOR-6 and XOR-7) is solved by connecting additional XOR gates (XOR-1, XOR-2 and XOR-3). The XOR gates (XOR-1, XOR-2 and XOR-3) are providing desired delay from PRBS at f bit per second (bps) to 2f bps, where f is the clock frequency.

The circuit connections may be decided based on the delay calculation while maintaining the MLS. For example, the output of XOR-1 is calculated as shown below:

$$D_0^{@2f\,bps} = D_{96}^{@2f\,bps} \oplus D_{97}^{@2f\,bps} \quad (2)$$

One of the delay $D_{96}^{@2f\,bps}$ is achieved by the calculation as mentioned below:

$$D_{96}^{@2f\,bps} = D_{32}^{@f\,bps} \oplus D_{95.5}^{@f\,bps} \quad (3)$$

The delays $D_{32}^{@f\,bps}$ and $D_{95.5}^{@f\,bps}$ are taken from outputs of DFF-5 and DFF-6, respectively. Similarly, another delay $D_{64}^{@2f\,bps}$ is calculated based on following equations.

$$D_0^{@2f\,bps} = D_{96}^{@2f\,bps} \oplus D_{97}^{@2f\,bps} \quad (4)$$

$$D_{127}^{@2f\,bps} = D_{96}^{@2f\,bps} \oplus D_{97}^{@2f\,bps} \quad (5)$$

$$D_{64+63}^{@2f\,bps} = D_{33+63}^{@2f\,bps} \oplus D_{34+63}^{@2f\,bps} \quad (6)$$

$$D_{64}^{@2f\,bps} = D_{33}^{@2f\,bps} \oplus D_{34}^{@2f\,bps} \quad (7)$$

Figure 5:
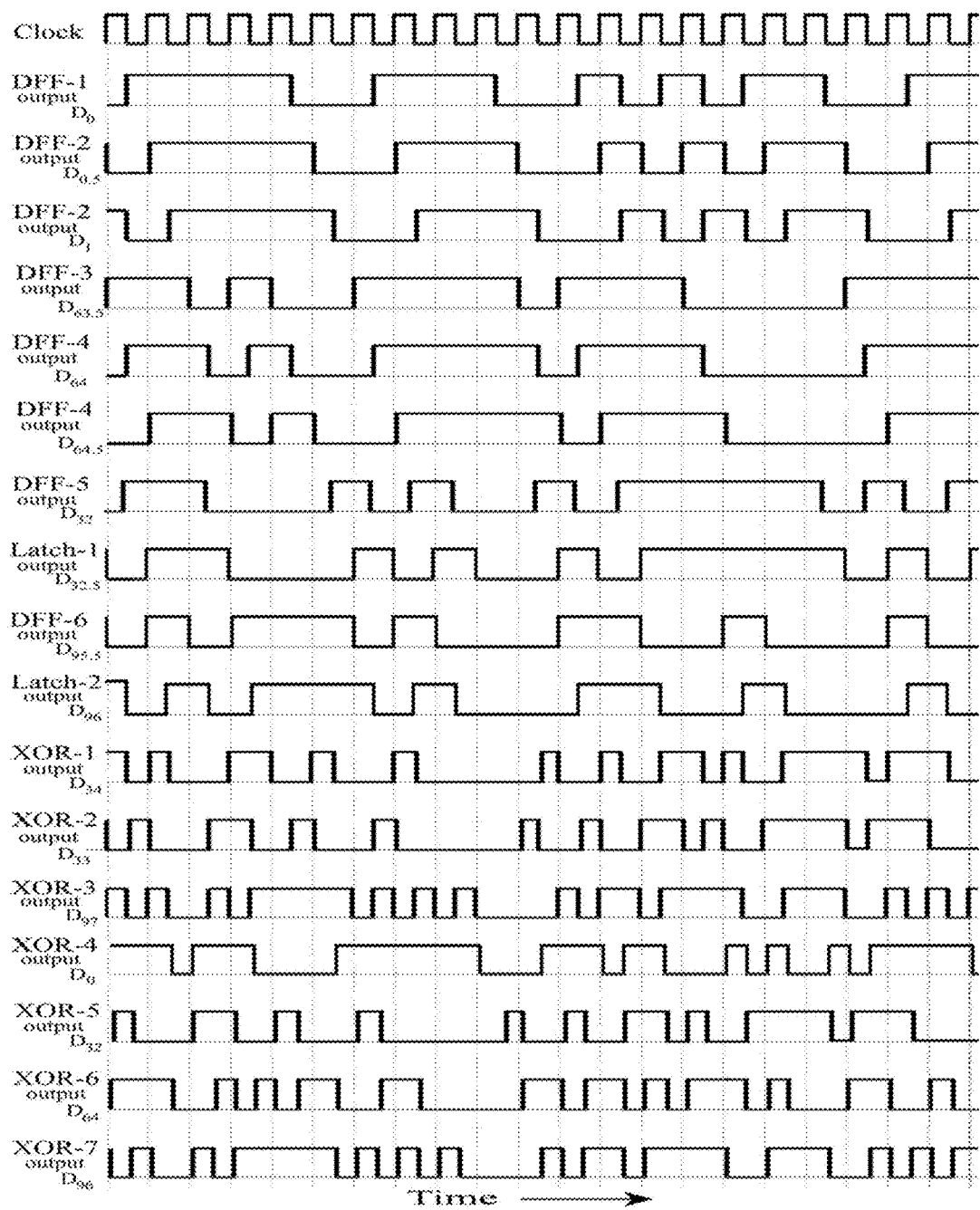
FIG. 5 shows timing diagram of the $2^7-1$ pseudo-random binary sequence (PRBS) generator, in accordance with an embodiment of the present disclosure.
Figure 6:
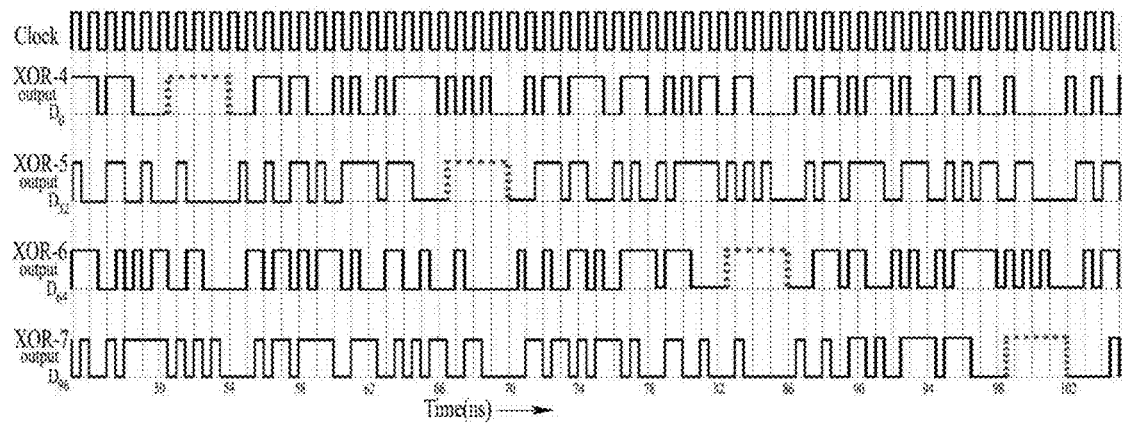
FIG. 6 shows PRBS response at outputs of the $2^7-1$ pseudo-random binary sequence (PRBS) generator, in accordance with an embodiment of the present disclosure.

The delay values are 1, 64.5, 32.5 and 96 for DFF-2, DFF-4, latch-1 and latch-2 respectively at f bps. Two outputs are taken from the middle of the DFF-2 and DFF-4, which have delays of 0.5 and 64 at f bps, respectively. Another two outputs have been taken from the DFF-5 and DFF-6 with delays of 32 and 95.5 at f bps, respectively. These outputs of the DFFs, latches, XOR-1, XOR-2, and XOR-3 are fed to the XOR-4, XOR-5, XOR-6, and XOR-7 to produce the final output of the PRBS generator as shown in FIG. 5. The PRBS generator outputs are shown in FIG. 6 in dotted portions in the waveforms. The waveforms repeat at 101.5 ns, 117.5 ns, 70 ns, and 86 ns. The reference point $D_0^{@2f\ bps}$ is chosen at the output of XOR-4 for 2f bps for better explanation. That is the reason why, shape of the waveform at the reference of $D_0^{@f\ bps}$ and $D_0^{@2f\ bps}$ is different. The waveforms repeat at the delays of 54 ns, 70 ns, 86 ns and 102 ns as shown in FIG. 6. Repetition of data in time instant between every alternative outputs can be given by $$dx = \frac{2^N}{f \times \text{No of outputs}} \quad (8)$$

In the disclosed PRBS generator, response is visible at outputs of XOR-4, XOR-5, XOR-6, XOR-7.

Figure 7:
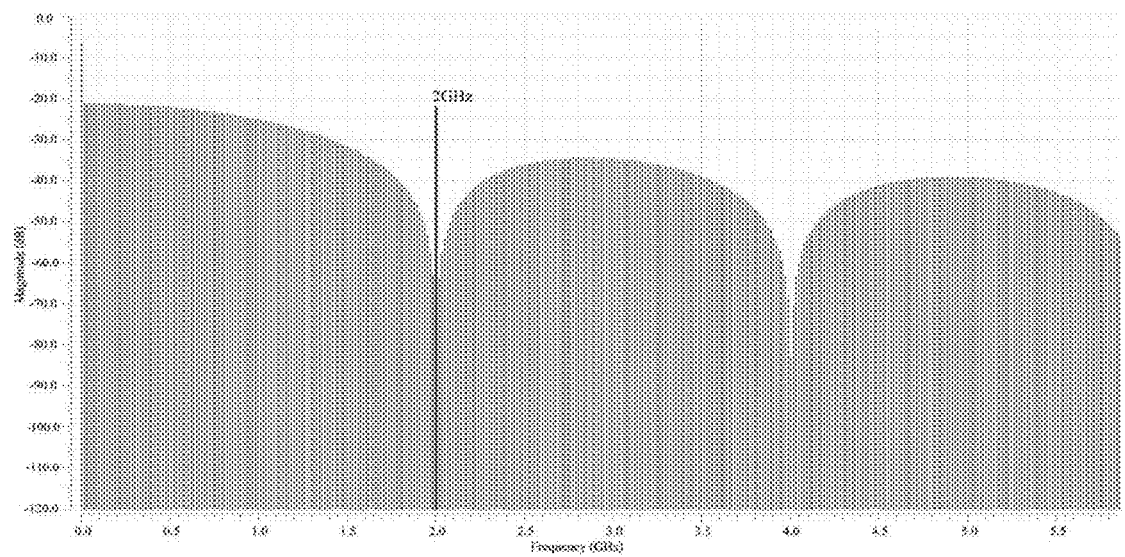
FIG. 7 shows null at 2 GHz in the spectrum of the $2^7-1$ pseudo-random binary sequence (PRBS) generator, in accordance with an embodiment of the present disclosure.
Figure 8:
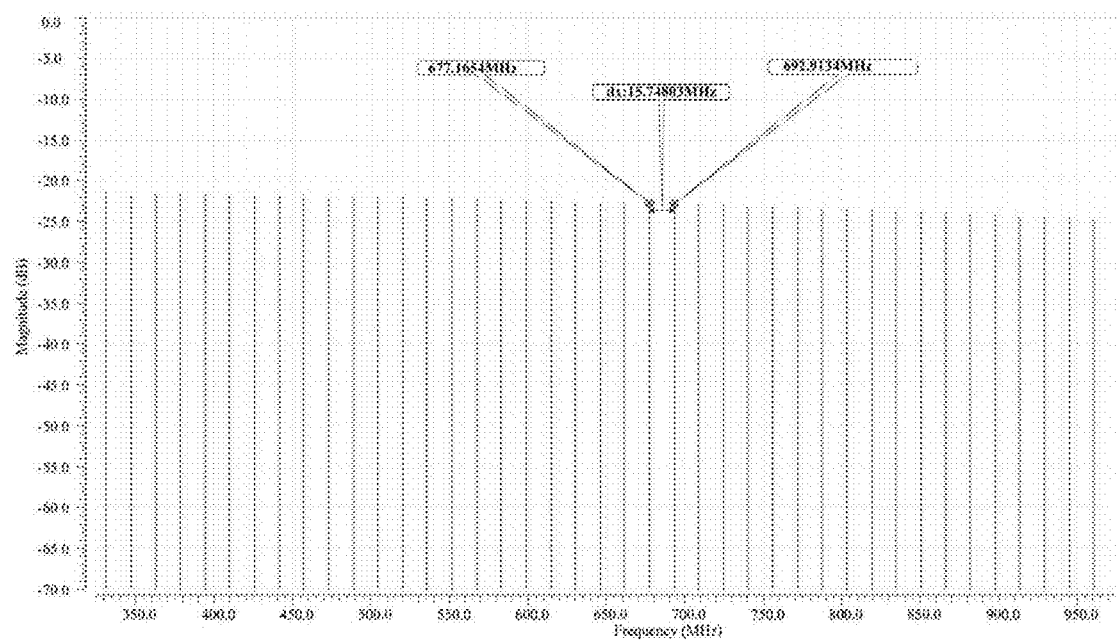
FIG. 8 shows the spectrum of the $2^7-1$ pseudo-random binary sequence (PRBS) generator output, in accordance with an embodiment of the present disclosure.

The MLS behaviour of PRBS is also verified by investigating the spectrum of PRBS generator's output. PRBS generator's power spectrum follows the sine squared function as shown in FIG. 7. In the spectrum, the null position always is at n/T, where n is an integer and T is the bit duration. In our case, the null position is at twice the clock frequency i.e. 2 GHz. The distance between two adjacent tone frequencies is $1/(2^N-1)$ T Hz. For the case of 7 bits, the spacing between tone frequencies is calculated at 15.74803 MHz. Therefore, the frequency spacing can decrease by increasing the data rate of a pseudo-random bit sequence.

Figure 9:
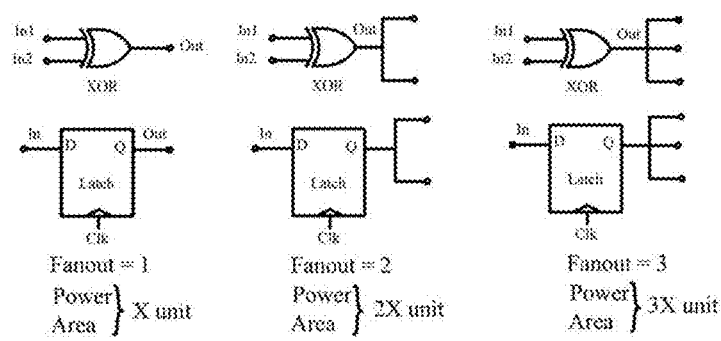
FIG. 9 shows the trend of power-area by using a number of outputs, in accordance with an embodiment of the present disclosure.

By using a number of outputs, the trend of power-area can be estimated as shown in FIG. 9.

Table 1 and 2 show comparison between conventional parallel implementations and the disclosed four output half-rate $2^7-1$ PRBS generator. It can be noticed from the below table that the disclosed PRBS generator shows 24.32% and 8.69% improvement as compared to conventionally used parallel implementations.

TABLE 1

PRBSG-7

| | Conventional Parallel Implementation | | | | | | | Disclosed Implementation | | | | | |
|---|---|---|---|---|---|---|---|---|---|---|---|---|---|
| Speed | L-1 | L-2 | L-3 | X-1 | X-2 | X-3 | MUX | L-1 | L-2 | L-3 | X-1 | X-2 | X-3 |
| 1X | 13 | 2 | 5 | 6 | 1 | 2 | 0 | 8 | 6 | 0 | 0 | 0 | 0 |
| 2X | 0 | 0 | 0 | 0 | 0 | 0 | 4 | 0 | 0 | 0 | 4 | 1 | 2 |

Improvement in proposed architecture as compared to commonly used architecture: 24.32 %

L-1 represents Latch with the fan-out 1
L-2 represents Latch with the fan-out 2
L-3 represents Latch with fan-out 3
MUX- Multiplexer
X-1 represents XOR gate with fan-out 1
X-2 represents XOR gate with fan-out 2
X-3 represents XOR gate with fan-out 3
2X represents doubledspeed

TABLE 2

PRBSG-7

| | Conventional Parallel Implementation | | | | | | | Disclosed Implementation | | | | | |
|---|---|---|---|---|---|---|---|---|---|---|---|---|---|
| Speed | L-1 | L-2 | L-3 | X-1 | X-2 | X-3 | MUX | L-1 | L-2 | L-3 | X-1 | X-2 | X-3 |
| 1X | 13 | 7 | 0 | 6 | 1 | 1 | 0 | 8 | 6 | 0 | 0 | 0 | 0 |
| 2X | 0 | 0 | 0 | 0 | 0 | 0 | 4 | 0 | 0 | 0 | 4 | 1 | 2 |

Improvement in proposed architecture as compared to commonly used architecture: 8.69 %

Figure 10:
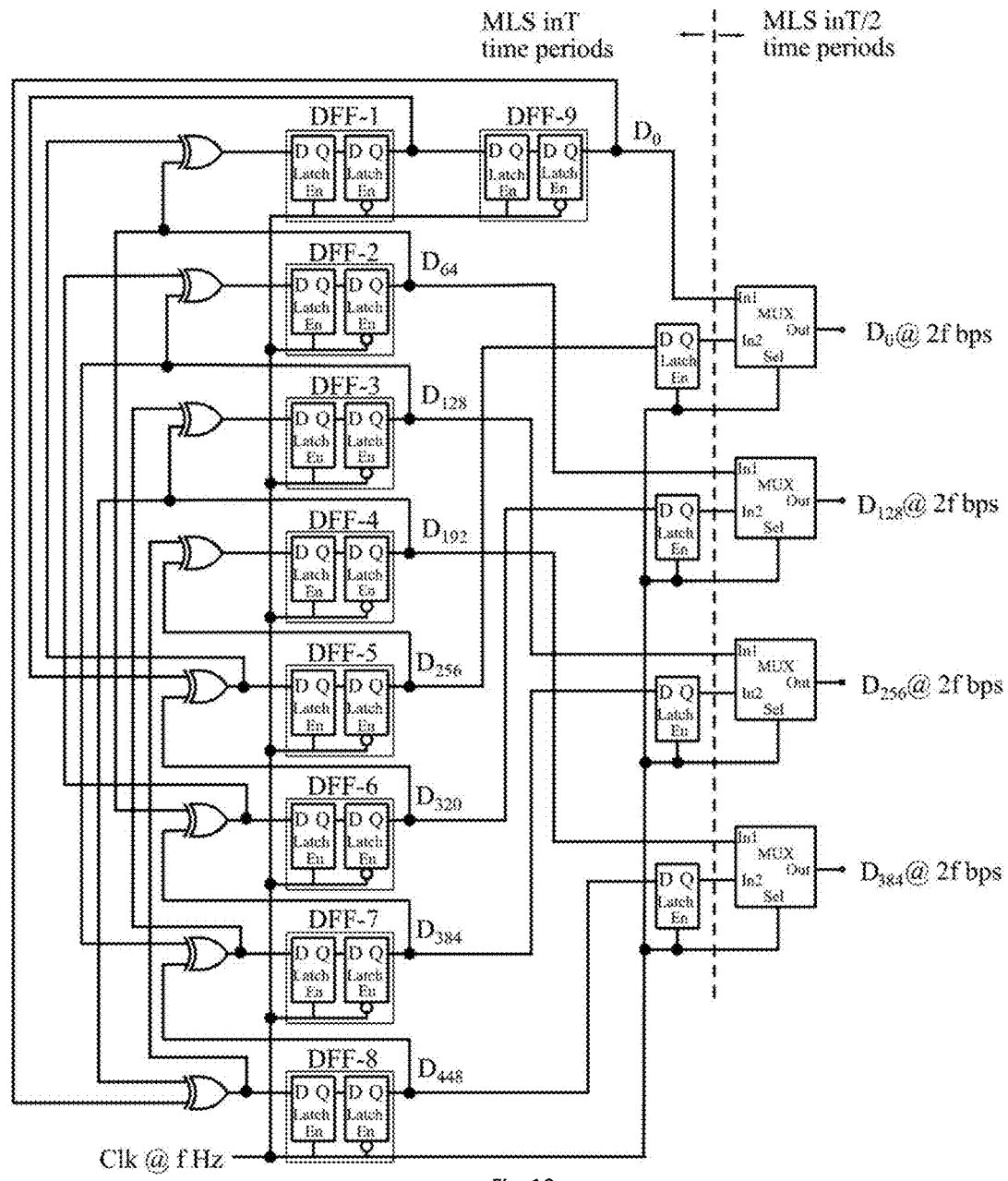
FIG. 10 shows a circuit diagram of a $2^9-1$ pseudo-random binary sequence (PRBS) generator, in accordance with prior art.

L-1 represents Latch with the fan-out 1
L-2 represents Latch with the fan-out 2
L-3 represents Latch with fan-out 3
MUX- Multiplexer
X-1 represents XOR gate with fan-out 1
X-2 represents XOR gate with fan-out 2
X-3 represents XOR gate with fan-out 3
2X represents doubledspeed In a second embodiment of the present disclosure, a $2^9-1$ pseudo-random binary sequence (PRBS) generator is disclosed. FIG. 10 shows a conventional $2^9-1$ pseudo-random binary sequence (PRBS) generator, whereas FIG. 11 shows a $2^9-1$ pseudo-random binary sequence (PRBS) generator, in accordance with an embodiment of the present disclosure.

FIG. 10 shows conventional parallel implementation of half-rate $2^9-1$ PRBS generator, which constitutes using 22 D-latches, 8 XOR gates, and 4 MUXs. The DFF are made from D-latches by connecting them in master-slave fashion. That is the reason why two latches involved in constituting DFF are oppositely clocked. There is one latch connected at the one of the input of MUX to retime the data. The MUXs are working on the doubled frequency than the D-latches. The output data-rate of the PRBS generator is doubled compared to applied clock frequency in this case. However, this architecture results in high power consumption and occupies high area.

Figure 11:
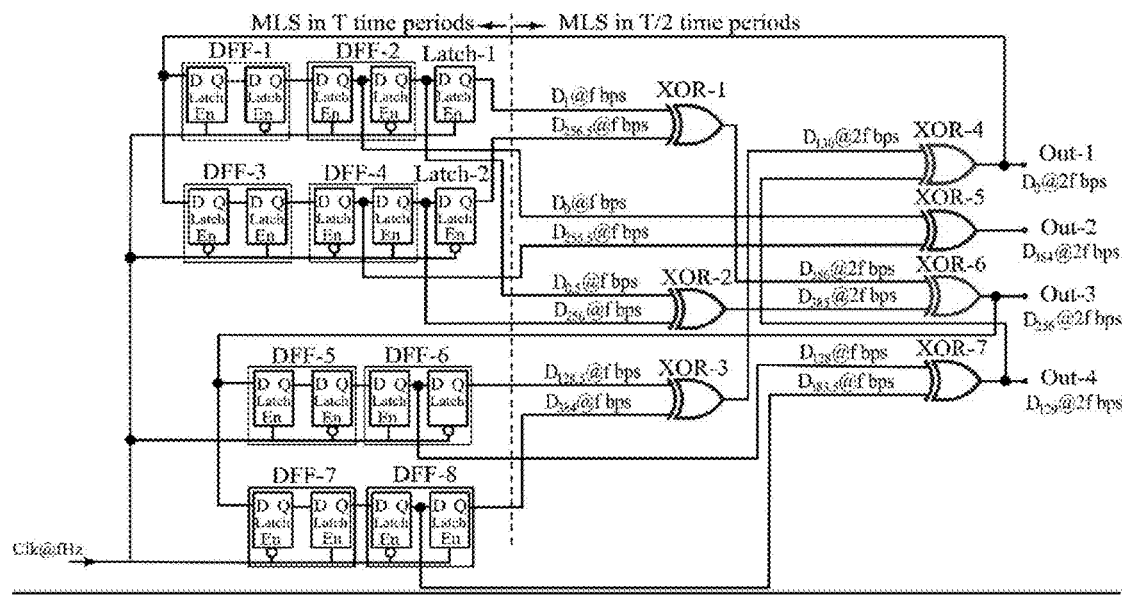
FIG. 11 shows a circuit diagram of the $2^9-1$ pseudo-random binary sequence (PRBS) generator, in accordance with an embodiment of the present disclosure.

The circuit diagram of disclosed four uncorrelated output half-rate $2^9-1$ PRBS generator architecture is shown in FIG. 11. As shown in FIG. 11, the disclosed PRBS generator may consists of 4 lanes, each having a latch group and a plurality of logic gates i.e. XOR gates. In this embodiment, pseudo-random binary sequence (PRBS) generator may comprise of 8 flip flop (DFF), 2 latches, and 7 XOR gates. In an embodiment, half of the circuit works at the clock frequency and the second half of the circuit is at doubled clock frequency. The characteristics equation for the disclosed architecture is:

$$D_9 \oplus D_4 \oplus D_0 = 0 \quad (9)$$

The latches are connected in series in four different lanes as shown in FIG. 11. The latches are clocked with opposite polarity in each of the lanes and every next latch is also clocked with opposite polarity. XOR gates (XOR-4, XOR-5, XOR-6 and XOR-7) are used to double the data rate at the output. The difficulty of getting desired delays at the input XOR gates (XOR-4, XOR-5, XOR-6 and XOR-7) is solved by connecting additional XOR gates (XOR-1, XOR-2 and XOR-3). The XOR gates (XOR-1, XOR-2 and XOR-3) are providing desired delay from PRBS at f bit per second (bps) to 2f bps, where f is the clock frequency.

The circuit connections may be decided based on the delay calculation while maintaining the MLS. For example, the output of XOR-1 is calculated as shown below:

$$D_0^{@2f\,bps} = D_{129}^{@2f\,bps} \oplus D_{130}^{@2f\,bps} \quad (10)$$

One of the delay D129@2f bps is achieved by the calculation as mentioned below:

$$D_{129}^{@2f\,bps} = D_{128}^{@f\,bps} \oplus D_{383.5}^{@f\,bps} \quad (11)$$

The delays $D_{129}^{@fbps}$ and $D_{383.5}^{@fbps}$ are taken from outputs of DFF-6 and DFF-8, respectively. Similarly, another delay $D_{256}^{@2fbps}$ is calculated based on the following equations.

$$D_0^{@2f\,bps} = D_{129}^{@2f\,bps} \oplus D_{130}^{@2f\,bps} \quad (12)$$

$$D_{511}^{@2f\,bps} = D_{129}^{@2fbps} \oplus D_{130}^{@2fbps} \quad (13)$$

$$D_{256+255}^{@2f\,bps} = D_{385+255}^{@2f\,bps} \oplus D_{386+255}^{@2f\,bps} \quad (14)$$

$$D_{256}^{@2f\,bps} = D_{385}^{@2f\,bps} \oplus D_{386}^{@2f\,bps} \quad (15)$$

Figure 12:
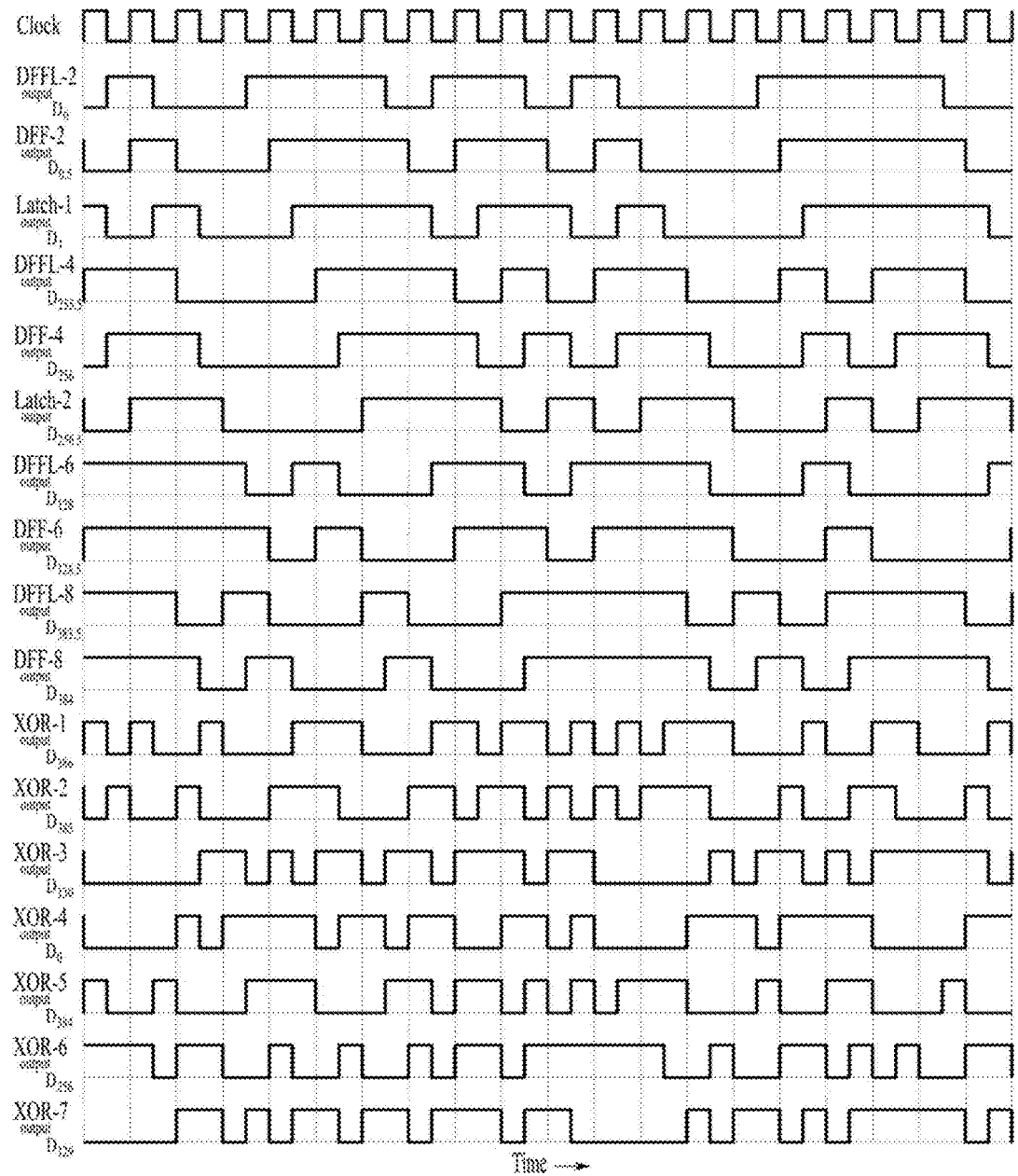
FIG. 12 shows timing diagram of the $2^9-1$ pseudo-random binary sequence (PRBS) generator, in accordance with an embodiment of the present disclosure.
Figure 13:
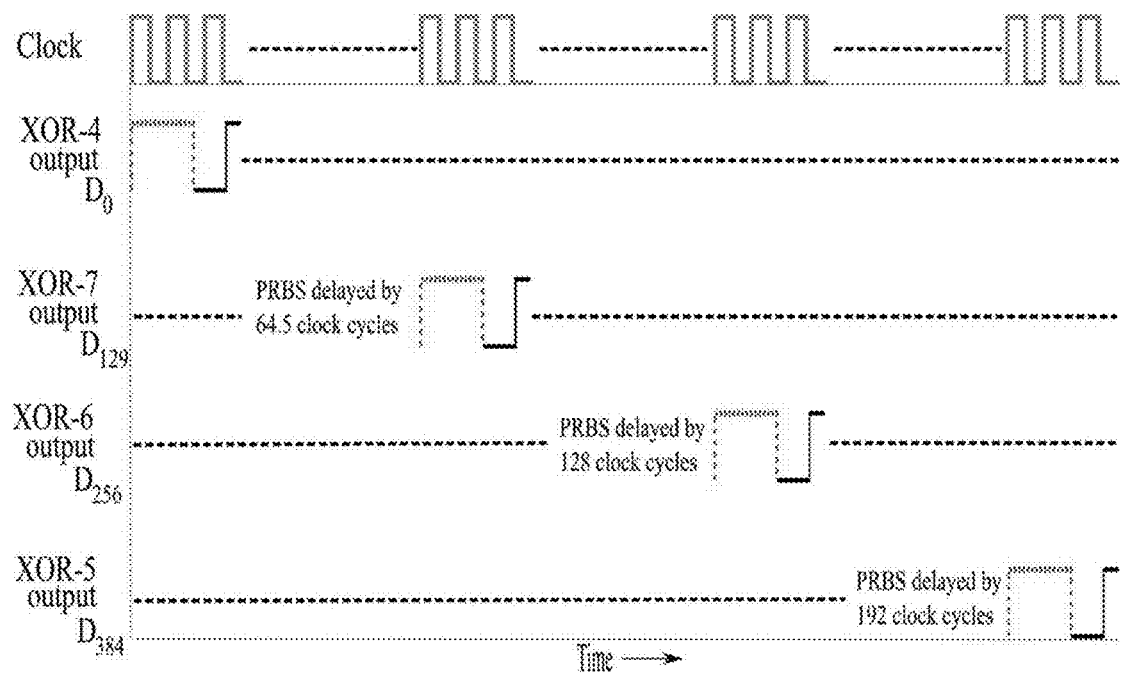
FIG. 13 shows PRBS response at outputs of the $2^9-1$ pseudo-random binary sequence (PRBS) generator, in accordance with an embodiment of the present disclosure.

The delay values are 1, 256.5, 128.5 and 384 for latch-1 and latch-2, DFF-6, DFF-7, respectively at f bps. Two outputs are taken from the middle of the DFF-2 and DFF-4, which have delays of 0 and 255.5 at f bps, respectively. Another two outputs have been taken from the middle of the DFF-6 and DFF-8 with delays of 128 and 383.5 at f bps, respectively. These outputs of the DFFs, latches, XOR-1, XOR-2, and XOR-3 are fed to the XOR-4, XOR-5, XOR-6, and XOR-7 to produce the final output of the PRBS generator as shown in FIG. 12. The reference point $D_0^{@2fbps}$ is chosen at the output of XOR-4 for 2f bps for better explanation. That is the reason why the shape of the waveform at the reference of $D_0^{@fbps}$ and $D_0^{@2f\,bps}$ is different. The waveforms repeat at the delays of 54 ns, 118.5 ns, 182 ns and 246 ns as shown in FIG. 13. In the proposed circuit, response is visible at outputs at XOR-4, XOR-7, XOR-6, XOR-5.

Figure 14:
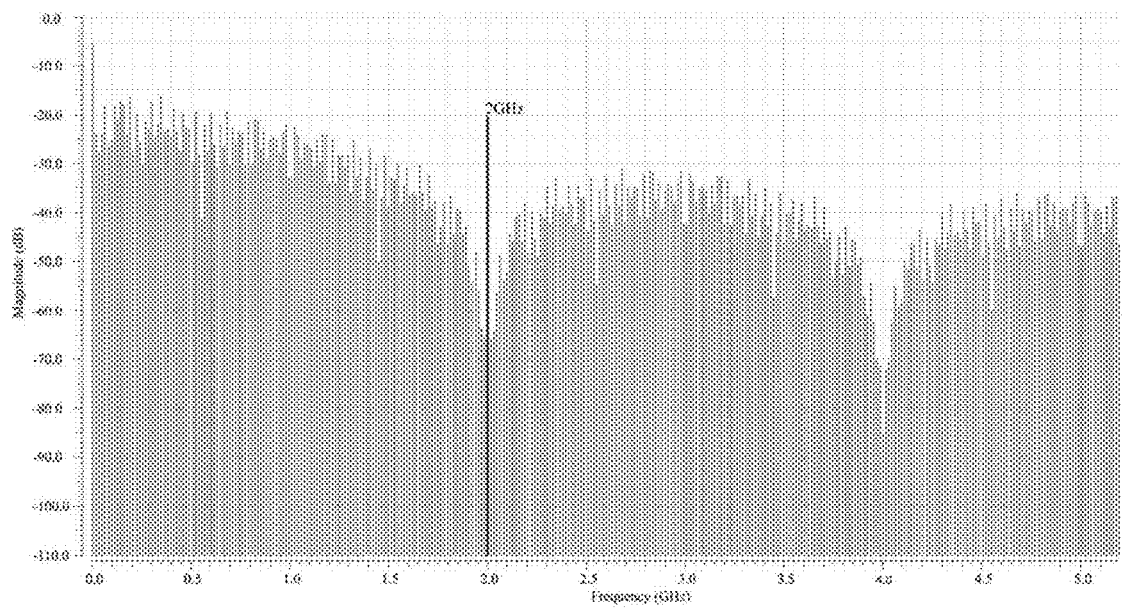
FIG. 14 shows null at 2 GHz in the spectrum of the $2^9-1$ pseudo-random binary sequence (PRBS) generator, in accordance with an embodiment of the present disclosure.
Figure 15:
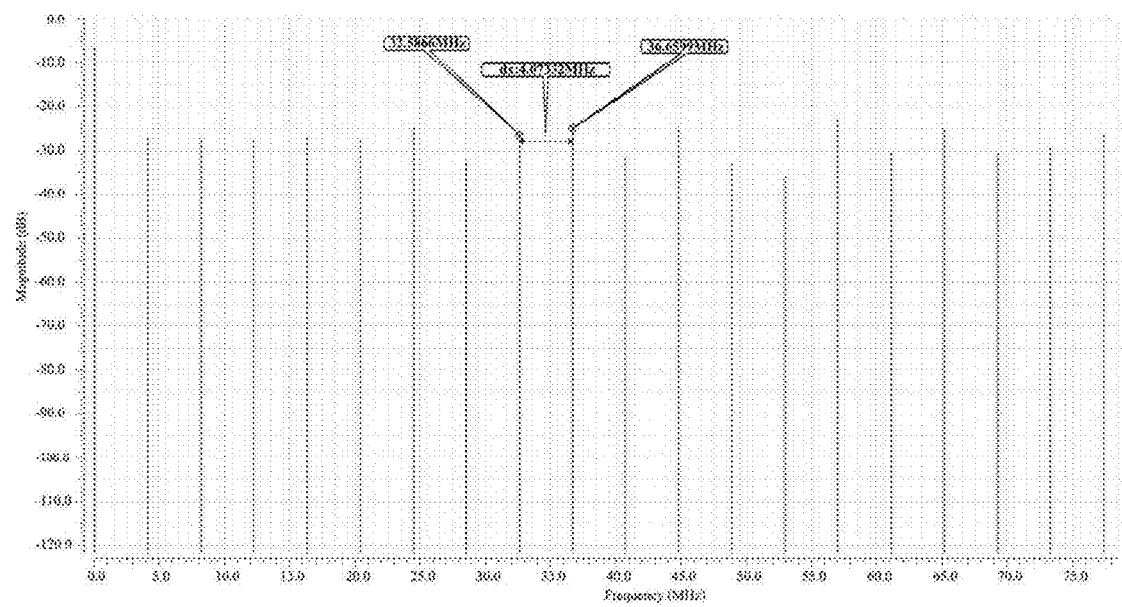
FIG. 15 shows spectrum of the $2^9-1$ pseudo-random binary sequence (PRBS) generator output, in accordance with an embodiment of the present disclosure.

The MLS behaviour of PRBS is also verified by investigating the spectrum of PRBS generator's output. PRBS generator's power spectrum follows the sine squared function as shown in FIG. 14. In the spectrum, the null position always is at n/T, where n is an integer and T is the bit duration. In our case, the null position is at twice the clock frequency i.e. 2 GHz. The distance between two adjacent tone frequencies is $1/(2^N-1)$ T Hz. For the case of 9 bits, the spacing between tone frequencies is calculated at 4.0733 MHz. Therefore, the frequency spacing can decrease by increasing the data rate of a pseudo-random bit sequence.

Table 3 shows comparison between conventional parallel implementation and the disclosed four output half-rate $2^9-1$ PRBS generator. It can be noticed from the below table that the disclosed PRBS generator shows 14.81% improvement as compared to conventionally used parallel implementations.

| | PRBSG-9 | | | | | | | | | | | |
|---|---|---|---|---|---|---|---|---|---|---|---|---|
| | Conventional Parallel Implementation | | | | | | | Disclosed Implementation | | | | |
| Speed | L-1 | L-2 | L-3 | X-1 | X-2 | X-3 | MUX | L-1 | L-2 | L-3 | X-1 | X-2 | X-3 |
| 1X | 13 | 5 | 4 | 5 | 3 | 0 | 0 | 12 | 6 | 0 | 0 | 0 | 0 |
| 2X | 0 | 0 | 0 | 0 | 0 | 0 | 4 | 0 | 0 | 0 | 4 | 1 | 2 |
| Improvement in proposed architecture as compared to commonly used architecture: 14.81 % | | | | | | | | | | | | | |

Figure 16:
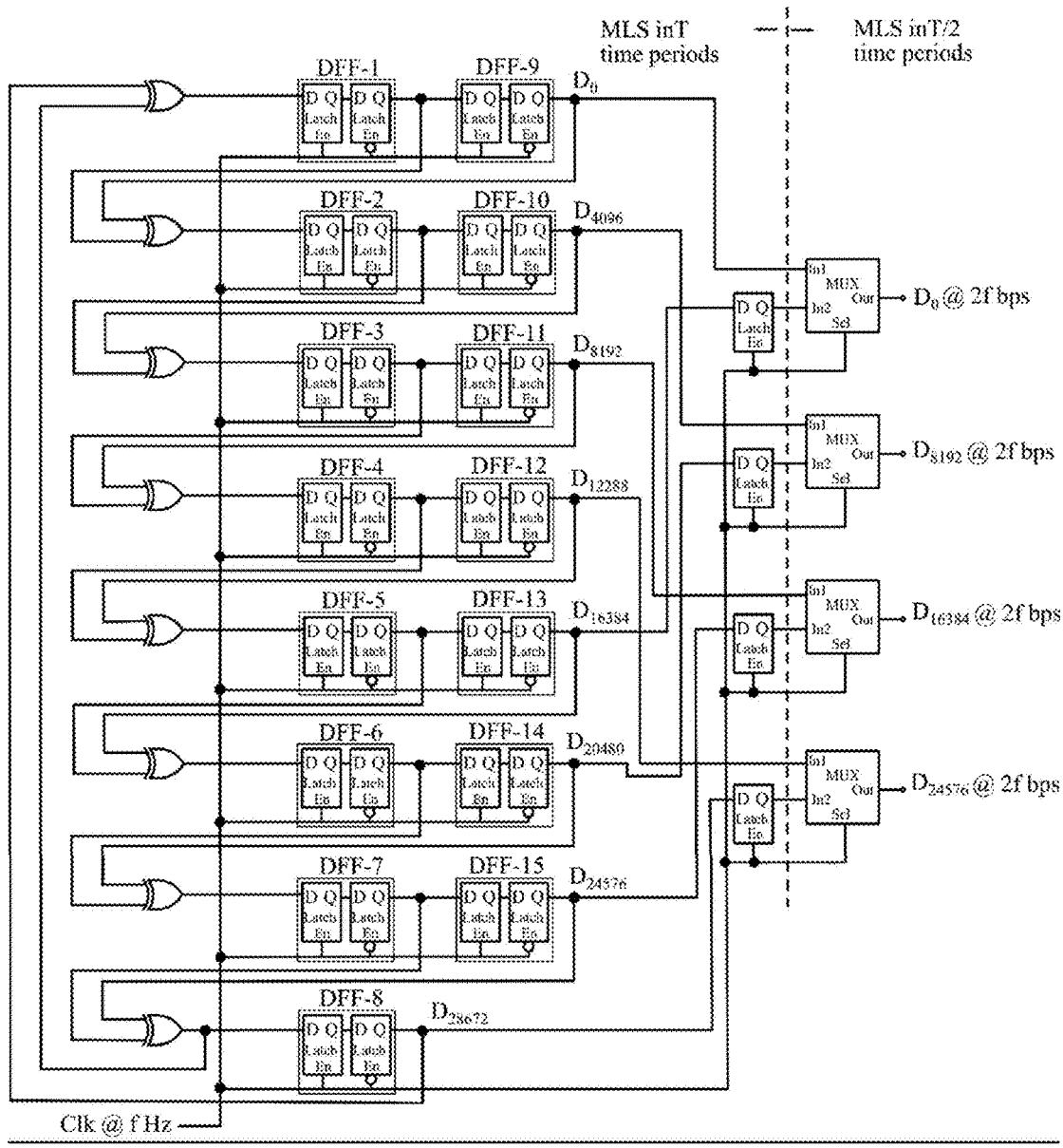
FIG. 16 shows a circuit diagram of the $2^{15}-1$ pseudo-random binary sequence (PRBS) generator, in accordance with prior art.

L-1 represents Latch with the fan-out 1
L-2 represents Latch with the fan-out 2
L-3 represents Latch with fan-out 3
MUX- Multiplexer
X-1 represents XOR gate with fan-out 1
X-2 represents XOR gate with fan-out 2
X-3 represents XOR gate with fan-out 3
2X represents doubledspeed In a third embodiment of the present disclosure, a $2^{15}-1$ pseudo-random binary sequence (PRBS) generator is disclosed. FIG. 16 shows a conventional $2^{15}-1$ pseudo-random binary sequence (PRBS) generator, whereas FIG. 17 shows a $2^{15}-1$ pseudo-random binary sequence (PRBS) generator, in accordance with an embodiment of the present disclosure.

A conventional four uncorrelated output half-rate $2^{15}-1$ bit PRBS generator shown in FIG. 16 is designed using 34 D-latches, 8 XOR gates, and 4 MUXs in the parallel implementation. The DFFs are made from D-latches. The feedback data is taken from DFFs to the XOR gates from all the fifteen DFFs. Then the signals are passed through the D latches and the MUXs. The DFF are made from D-latches by connecting them in master-slave fashion. That is the reason why two latches involved in constituting DFF are oppositely clocked. There is one latch connected at the one of the input of MUX to retime the data. The MUXs are working on the doubled frequency than the D-latches. The output data-rate of the PRBS generator is doubled compared to applied clock frequency in this case. However, this architecture results in high power consumption and occupies high areas.

Figure 17:
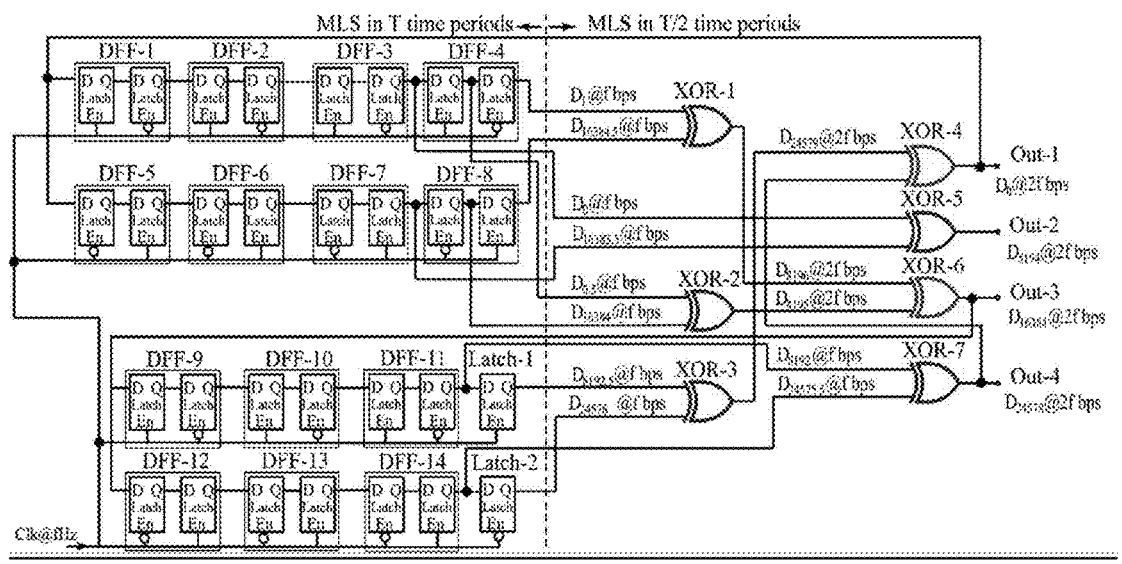
FIG. 17 shows a circuit diagram of the $2^{15}-1$ pseudo-random binary sequence (PRBS) generator, in accordance with an embodiment of the present disclosure.

The circuit diagram of disclosed four uncorrelated output half-rate $2^{15}-1$ PRBS generator architecture is shown in FIG. 17. As shown in FIG. 17, the disclosed PRBS generator may consists of 4 lanes, each having a latch group and a plurality of logic gates i.e. XOR gates. In this embodiment, pseudo-random binary sequence (PRBS) generators may comprise of 14 flip flop (DFF), 2 latches, and 7 XOR gates. In an embodiment, half of the circuit works at the clock frequency and the second half of the circuit is at doubled clock frequency. The characteristics equation for the proposed architecture is:

$$D_{15} \oplus D_7 \oplus D_0 = 0 \quad (16)$$

The latches are connected in series in four different lanes as shown in FIG. 17. The latches are clocked with opposite polarity in each of the lanes and every next latch is also clocked with opposite polarity. XOR gates (XOR-4, XOR-5, XOR-6 and XOR-7) are used to double the data rate at the output. The difficulty of getting desired delays at the input XOR gates (XOR-4, XOR-5, XOR-6 and XOR-7) is solved by connecting additional XOR gates (XOR-1, XOR-2 and XOR-3). The XOR gates (XOR-1, XOR-2 and XOR-3) are providing desired delay from PRBS at f bit per second (bps) to 2f bps, where f is the clock frequency.

The circuit connections are decided based on the delay calculation while maintaining the MLS. For example, the output of XOR-1 is is calculated as shown below:

$$D_0{}^{@2f\,bps} = D_{24578}{}^{@2f\,bps} \oplus D_{24579}{}^{@2f\,bps} \quad (17)$$

One of the delay $D_{24578}{}^{@2f\,bps}$ is achieved by the calculation as mentioned below:

$$D_{24578}{}^{@2f\,bps} = D_{8192}{}^{@f\,bps} \oplus D_{24575.5}{}^{@f\,bps} \quad (18)$$

The delays $D_{8192}{}^{@f\,bps}$ and $D_{24575.5}{}^{@f\,bps}$ are taken from outputs of DFF-11 and DFF-14, respectively. Similarly, another delay $D_{16384}{}^{@2f\,bps}$ is calculated based on the following equations.

$$D_0{}^{@2f\,bps} = D_{24578}{}^{@2f\,bps} \oplus D_{24579}{}^{@2f\,bps} \quad (19)$$

$$D_{32767}{}^{@2f\,bps} = D_{24578}{}^{@2f\,bps} \oplus D_{24579}{}^{@2f\,bps} \quad (20)$$

$$D_{16384+16383}{}^{@2f\,bps} = D_{8195+16383}{}^{@2f\,bps} \oplus D_{8196+16383}{}^{@2f\,bps} \quad (21)$$

$$D_{16384}{}^{@2f\,bps} = D_{8195}{}^{@2f\,bps} \oplus D_{8196}{}^{@2f\,bps} \quad (22)$$

Figure 18:
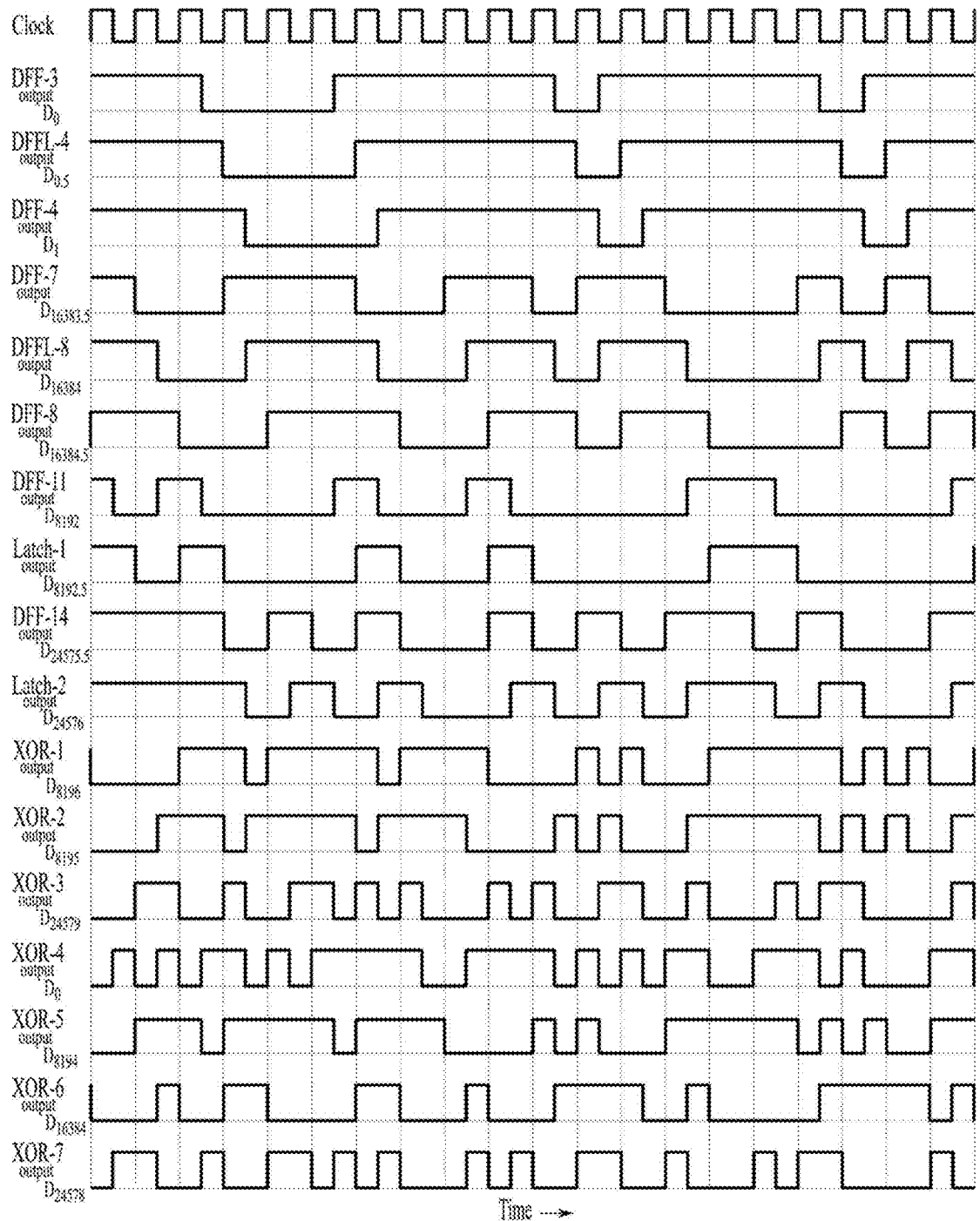
FIG. 18 shows timing diagram of the $2^{15}-1$ pseudo-random binary sequence (PRBS) generator, in accordance with an embodiment of the present disclosure.
Figure 19:
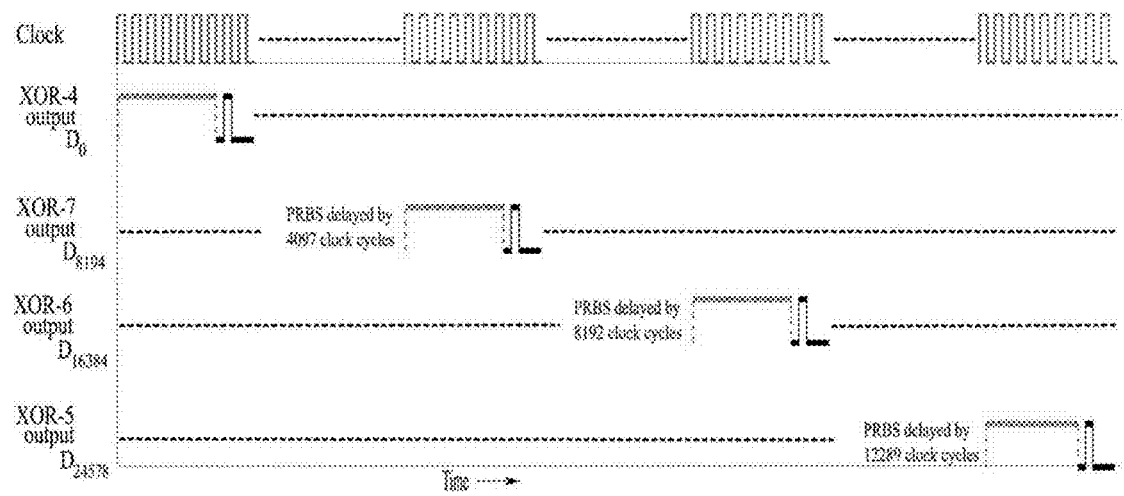
FIG. 19 shows PRBS response at outputs of the $2^{15}-1$ pseudo-random binary sequence (PRBS) generator, in accordance with an embodiment of the present disclosure.

The delay values are 1, 16384.5, 8192.5 and 24576 for DFF-4, DFF-8, latch-1 and latch-2 respectively at f bps. Two outputs are taken from the middle of the DFF-4 and DFF-8, which have delays of 0.5 and 16384 at f bps, respectively. Another two outputs have been taken from the DFF-11 and DFF-14 with delays of 8192 and 24575.5 at f bps, respectively. These outputs of the DFFs, latches, XOR-1, XOR-2, and XOR-3 are fed to the XOR-4, XOR-5, XOR-6, and XOR-7 to produce the final output of the PRBS generator as shown in FIG. 18. The reference point $D_0{}^{@2f\,bps}$ is chosen at the output of XOR-4 for 2f bps for better explanation. That is the reason why, shape of the waveform at the reference of $D_0{}^{@f\,bps}$ and $D_0{}^{@2f\,bps}$ is different. The waveforms repeat at the delays of 3.439 µs, 7.536 µs, 11.632 µs and 15.729 µs as shown in FIG. 19. In the proposed circuit, response is visible at outputs at XOR-4, XOR-5, XOR-6, XOR-7.

Figure 20:
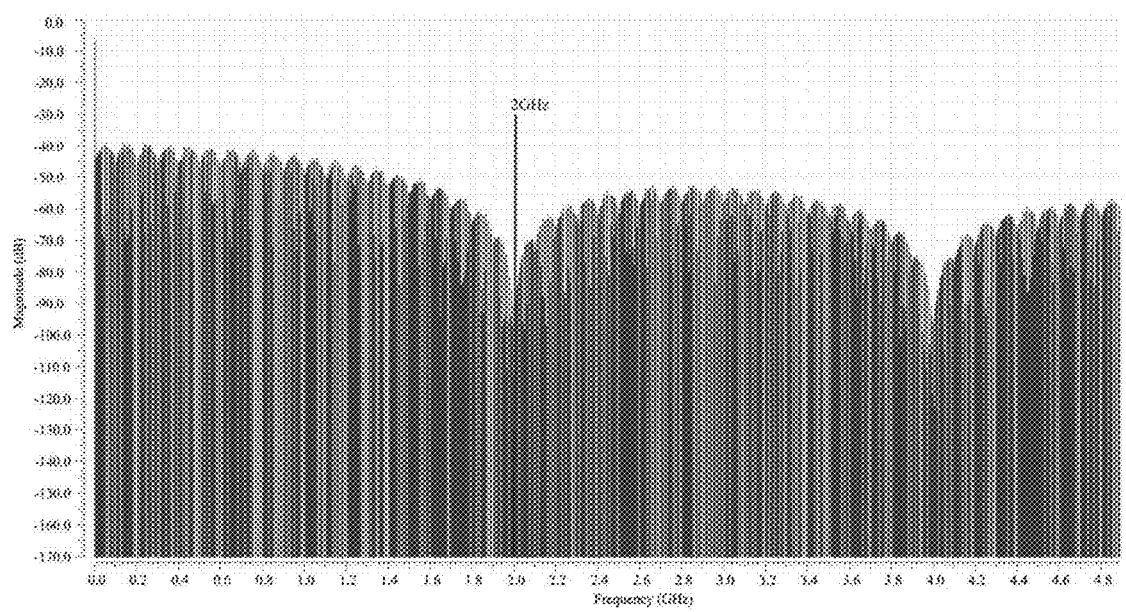
FIG. 20 shows null at 2 GHz in the spectrum of the $2^{15}-1$ pseudo-random binary sequence (PRBS) generator, in accordance with an embodiment of the present disclosure.
Figure 21:
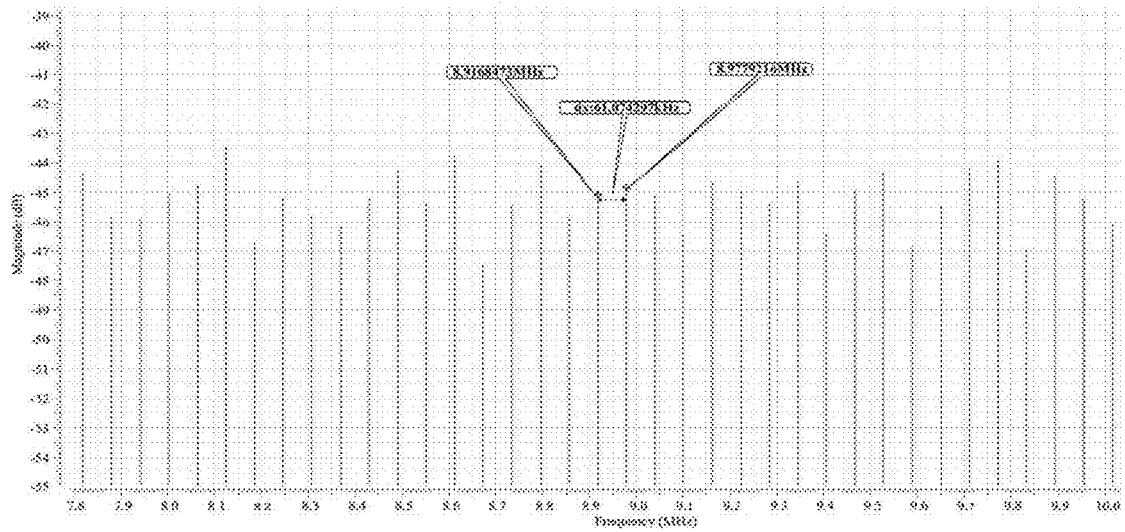
FIG. 21 shows spectrum of the $2^{15}-1$ pseudo-random binary sequence (PRBS) generator output, in accordance with an embodiment of the present disclosure.

The MLS behaviour of PRBS is also verified by investigating the spectrum of PRBS generator's output. PRBS generator's power spectrum follows the sine squared function as shown in FIG. 20. In the spectrum, the nulls' position always is at n/T, where n is an integer and T is the bit duration. In our case, the null position is at twice the clock frequency i.e. 2 GHz. The distance between two adjacent tone frequencies is $1/(2^N-1)$ T Hz. For the case of 7 bits, the spacing between tone frequencies is calculated at 61.074 kHz. Therefore, the frequency spacing can decrease by increasing the data rate of a pseudo-random bit sequence.

Table 4 shows comparison between conventional parallel implementation and the disclosed four output half-rate $2^{15}-1$ PRBS generator. It can be noticed from the below table that the disclosed PRBS generator shows 16.92% improvement as compared to conventionally used parallel implementations.

| | PRBSG-15 | | | | | | | | | | | | |
|---|---|---|---|---|---|---|---|---|---|---|---|---|---|
| | Conventional Parallel Implementation | | | | | | | Disclosed Implementation | | | | | |
| Speed | L-1 | L-2 | L-3 | X-1 | X-2 | X-3 | MUX | L-1 | L-2 | L-3 | X-1 | X-2 | X-3 |
| 1X | 19 | 15 | 0 | 7 | 1 | 0 | 0 | 24 | 6 | 0 | 0 | 0 | 0 |
| 2X | 0 | 0 | 0 | 0 | 0 | 0 | 4 | 0 | 0 | 0 | 4 | 1 | 2 |
| Improvement in proposed architecture as compared to commonly used architecture: 16.92 % | | | | | | | | | | | | | |

Figure 22:
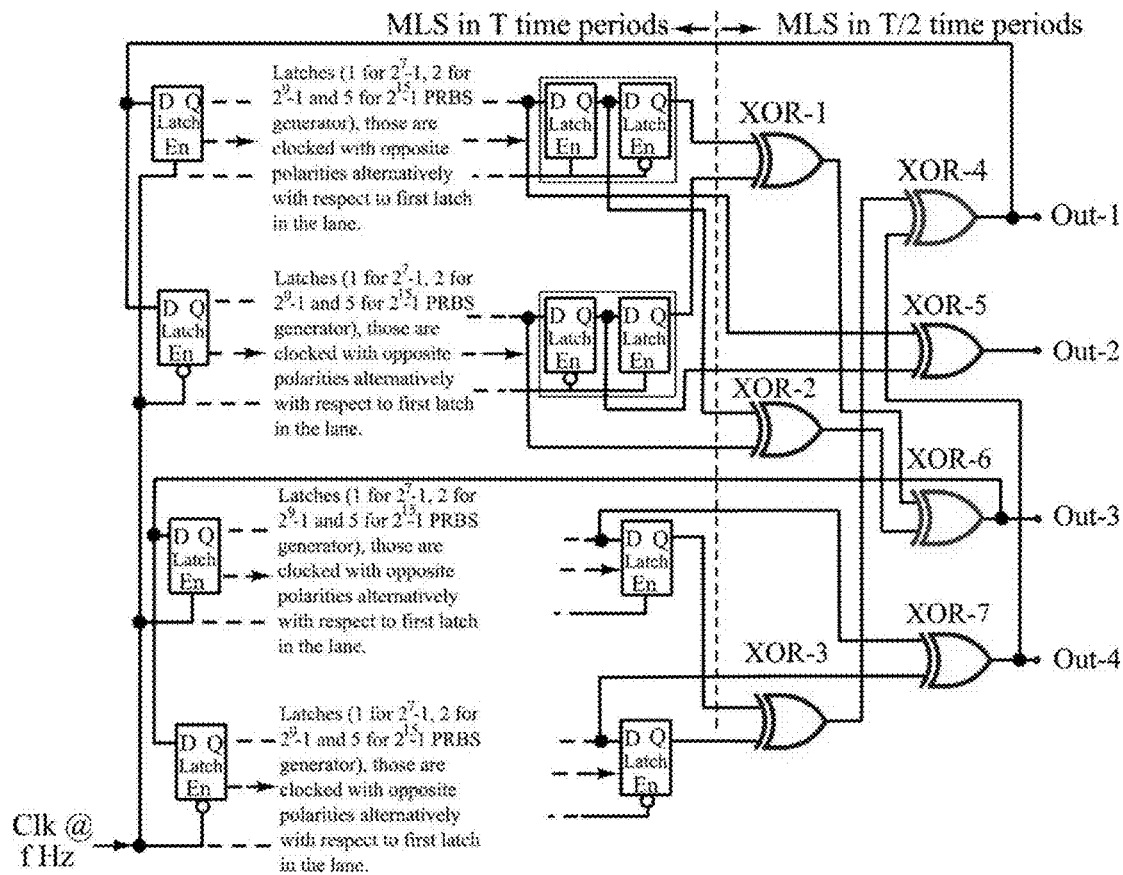
FIG. 22 shows architecture for designing $2^7-1$, $2^9-1$, and $2^{15}-1$ pseudo-random binary sequence (PRBS) generator, in accordance with an embodiment of the present disclosure.

L-1 represents Latch with the fan-out 1
L-2 represents Latch with the fan-out 2
L-3 represents Latch with fan-out 3
MUX- Multiplexer
X-1 represents XOR gate with fan-out 1
X-2 represents XOR gate with fan-out 2
X-3 represents XOR gate with fan-out 3
2X represents doubledspeed FIG. 22 shows a generalized flow of the designing approach. The disclosed architecture can easily be modified to $2^9-1$ and $2^{15}-1$ PRBS generators by changing the latches. The $2^9-1$ and $2^{15}-1$ PRBS generators provide 4 uncorrelated outputs same as the proposed $2^9-1$ PRBS generator. For $2^9-1$ PRBS generators, two latches are required, as shown in FIG. 22. In the same way, five latches are required to be added at the given place for $2^{15}-1$ PRBS generators. These latches are clocked with opposite polarity. In the proposed $2^9-1$ PRBS generator, the $4^{th}$ output has an additional delay of one bit at doubled clock rate PRBS. This additional delay can also be said as half clock cycle time period delay with respect to clock frequency. In the same manner, in the proposed $2^{15}-1$ PRBS generator, the additional delay of 2 bit at doubled clock rate PRBSs or one clock cycle time period delay at clock frequency are visible at $2^{nd}$ and $4^{th}$ outputs. However, the effect of additional delays can not limit the exhaustive testing of multiple output high speed circuits under test. For exhaustive testing, 2 clock period delays and for better crosstalk measurement, 4 clock period delays are sufficient.

FIG. 3 depicts a method 300 for generating an output pseudo-random binary sequence (PRBS) for performing on-chip testing by using pseudo-random binary sequence (PRBS) generator (200), in accordance with an embodiment of the present disclosure. As illustrated in FIG. 3, the method 300 includes one or more blocks illustrating a method for embedding a creative content with an image. The method 300 may be described in the general context of computer executable instructions. Generally, computer executable instructions can include routines, programs, objects, components, data structures, procedures, modules, and functions, which perform specific functions or implement specific abstract data types.

The order in which the method 300 is described is not intended to be construed as a limitation, and any number of the described method blocks can be combined in any order to implement the method. Additionally, individual blocks may be deleted from the methods without departing from the spirit and scope of the subject matter described.

At block 301, the method 300 may include providing a plurality of lanes, wherein each lane comprises a latch group capable of receiving clock signals, wherein a number of latches in each latch group is based on the output sequence to be generated for performing the on-chip testing.

At block 303, the method 300 may include connecting each latch group having at least one of a flip flop and a latch with a plurality of logic gates in such a manner that an output, generated by the at least one of the flip-flop and the latch of each latch group, is provided as an input to the plurality of logic gates for generating the output sequence required for performing the on-chip testing.

The method 300 may also include operating at least one of the plurality of logic gates and at least one latch in each latch group at a half clock frequency.

The method 300 may also include connecting the latches in each latch group in series.

The method 300 may also include generating the output sequence at double clock frequency A description of an embodiment with several components in communication with each other does not imply that all such components are required. On the contrary, a variety of optional components are described to illustrate the wide variety of possible embodiments of the invention.

When a single device or article is described herein, it will be clear that more than one device/article (whether they cooperate) may be used in place of a single device/article. Similarly, where more than one device or article is described herein (whether they cooperate), it will be clear that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments of the invention need not include the device itself.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based here on. Accordingly, the embodiments of the present invention are intended to be illustrative, but not limiting, of the scope of the invention, which is set forth in the following claims.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope and spirit of the disclosed embodiments. It must also be noted that as used herein and in the appended claims, the singular forms "a," "an," and "the" include plural references unless the context clearly dictates otherwise.

Advantages of the embodiment of the present disclosure are illustrated herein:
1. Less area required for implementation.
2. 20% fewer building blocks used for implementation.
3. Can be easily converted to $2^7-1$ or $2^9-1$ or $2^{15}-1$ by changing the number of latches.
4. Can generate four uncorrelated PRB-sequences at doubled clock rate.

The invention claimed is:
1. A pseudo-random binary sequence (PRBS) generator for performing on-chip testing, comprising:
a plurality of lanes consisting of a combination of at least flip flops selected in a range of 6-14, 2 latches, and 7 logic gates,
wherein each lane comprises a latch group configured for receiving clock signals,
wherein a number of latches in each latch group is based on an output sequence to be generated for performing the on-chip testing, and
wherein each of the latch group having at least the flip flops selected in the range of 6-14 and a latch of one of the 2 latches or the flip flops selected in the range of 6-14 are further connected with a plurality of logic gates of the 7 logic gates in such a manner that an output, generated by the at least the flip-flops selected in the range of 6-14 and the latch of each of the latch group, is provided as an input to the plurality of logic gates for generating the output sequence required for performing the on-chip testing.
2. The pseudo-random binary sequence (PRBS) generator as claimed in claim 1, wherein at least one of the plurality of logic gates and at least one latch in each of the latch group operates at a clock frequency.
3. The pseudo-random binary sequences (PRBS) generator as claimed in claim 1, wherein latches in each of the latch group are connected in series.

4. The pseudo-random binary sequences (PRBS) generator as claimed in claim 1, wherein the output sequence is generated at double the clock frequency.

5. The pseudo-random binary sequence (PRBS) generator as claimed in claim 1, wherein each of the 7 logic gates is an XOR logic gate.

6. The pseudo-random binary sequences (PRBS) generator as claimed in claim 1, wherein the combination further comprises at least one of: 6 flip flops, 2 latches, and 7 logic gates; 8 flip flops, 2 latches and 7 logic gates; or 14 flip flops, 2 latches, and 7 logic gates.

7. A method for generating an output sequence for performing on-chip testing by using pseudo-random binary sequence (PRBS) generator, comprising:

providing a plurality of lanes consisting of a combination of at least flip flops selected in a range of 6-14, 2 latches, and 7 logic gates, wherein each lane comprises a latch group configured for receiving clock signals, and wherein a number of latches in each latch group is based on the output sequence to be generated for performing the on-chip testing; and connecting each of the latch group having at least the flip flops selected in the range of 6-14 and a latch of one of the 2 latches or the flip flops selected in the range of 6-14 with a plurality of logic gates of the 7 logic gates in such a manner that an output, generated by the at least the flip-flops selected in the range of 6-14 and the latch of each of the latch group, is provided as an input to the plurality of logic gates for generating the output sequence required for performing the on-chip testing.

8. The method as claimed in claim 7, further comprising:

operating at least one of the plurality of logic gates and at least one latch in each of the latch group at a clock frequency.

9. The method as claimed in claim 7, further comprising: connecting latches in each of the latch group in series.

10. The method as claimed in claim 7, further comprising: generating the output sequence at double the clock frequency.

* * * * *